(12) United States Patent
Hino et al.

(10) Patent No.: US 8,994,246 B2
(45) Date of Patent: Mar. 31, 2015

(54) ACTUATOR

(75) Inventors: Tetsuo Hino, Yamato (JP); Amita Goyal, Bangalore (IN); Sotomitsu Ikeda, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 146 days.

(21) Appl. No.: 13/876,825

(22) PCT Filed: Sep. 26, 2011

(86) PCT No.: PCT/JP2011/072708
§ 371 (c)(1),
(2), (4) Date: Mar. 28, 2013

(87) PCT Pub. No.: WO2012/043845
PCT Pub. Date: Apr. 5, 2012

(65) Prior Publication Data
US 2013/0181572 A1 Jul. 18, 2013

(30) Foreign Application Priority Data

Oct. 1, 2010 (JP) ................................ 2010-224152

(51) Int. Cl.
*H02N 11/00* (2006.01)
*B29C 43/10* (2006.01)
(52) U.S. Cl.
USPC ........................... 310/300; 264/571; 977/932

(58) Field of Classification Search
USPC .................... 310/300–306; 264/571; 977/932
See application file for complete search history.

(56) References Cited

U.S. PATENT DOCUMENTS

| 3,358,162 | A  | * | 12/1967 | Krake et al. | 310/306 |
| 6,555,045 | B2 | * | 4/2003 | McClure et al. | 264/510 |
| 7,944,007 | B1 | * | 5/2011 | Liu et al. | 257/415 |
| 2011/0209820 | A1 | * | 9/2011 | Shi et al. | 156/244.17 |
| 2011/0281070 | A1 | * | 11/2011 | Mittal et al. | 428/142 |
| 2012/0133243 | A1 | * | 5/2012 | Okuzaki et al. | 310/300 |
| 2012/0235543 | A1 | * | 9/2012 | Suda et al. | 310/363 |

FOREIGN PATENT DOCUMENTS

| JP | 6-006991 A | 1/1994 |
| JP | 2007-126624 A | 5/2007 |
| JP | 2007-185016 A | 7/2007 |
| WO | 2007/080959 A1 | 7/2007 |
| WO | 2009/069086 A2 | 6/2009 |

* cited by examiner

*Primary Examiner* — Thomas Dougherty
(74) *Attorney, Agent, or Firm* — Canon U.S.A. Inc., IP Division

(57) ABSTRACT

Provided is an actuator simultaneously having better deformation response characteristics and larger generative force. The actuator includes a pair of opposing electrodes and an intermediate layer disposed therebetween. The intermediate layer contains at least an electrolyte and includes at least a polymer fiber layer. The polymer fiber layer includes a plurality of polymer fibers crossing each other and intertwined three-dimensionally. The polymer fiber layer has fused portions at intersections of the polymer fibers.

15 Claims, 6 Drawing Sheets

| Ionic liquid | Example 4<br>BMPyTfNTf | Comparative Example 3<br>DMMATfNTf |
|---|---|---|
| Results of actuation at ±1 V and 0.1 Hz |  |  |
| Average displacement (mm) | 0.45 | 0.35 |

ACTUATOR

TECHNICAL FIELD

The present invention relates to actuators.

BACKGROUND ART

Recently, organic polymer actuators have been developed.

PTL 1 discloses a conductive polymer actuator including a working electrode, a counter electrode disposed opposite the working electrode, and an interlayer film in contact with the two electrodes, all of which are immersed in an electrolytic solution. A voltage applied across the working electrode and the counter electrode causes the working electrode to extend and contract in the electrolytic solution.

According to Example 2 of PTL 1, the working electrode is a cylindrical gold-polypyrrole composite, and the interlayer film is a porous polyvinyl alcohol film formed by electrospinning (electrospun sheet). The outer surface of the cylindrical working electrode is covered with the electrospun sheet and is further covered with the polypyrrole counter electrode to form an electrode assembly. The electrode assembly is sealed in a glass tube by pouring an electrolytic solution, thus fabricating an actuator.

An extensible actuator, such as the one disclosed in PTL 1, needs to be formed of a material that can be flexibly extended and contracted because the entire actuator extends and contracts in the longitudinal direction. That is, an intermediate layer formed of a more extensible and flexible film provides better deformation response characteristics, although it has a lower mechanical strength.

Accordingly, it is difficult for the actuator itself to achieve sufficient generative force, and it is therefore difficult for the actuator to simultaneously achieve better deformation response characteristics and larger generative force.

PTL 2, on the other hand, discloses a bending actuator including a cation exchange film as an intermediate layer between a pair of electrodes. A potential difference applied across the cation exchange film causes it to curve or bend. However, the cation exchange film itself does not have good deformation response characteristics.

CITATION LIST

Patent Literature

PTL 1 Japanese Patent Laid-Open No. 2007-185016
PTL 2 Japanese Patent Laid-Open No. 6-6991

SUMMARY OF INVENTION

Technical Problem

The present invention provides a bending actuator having good deformation response characteristics and large generative force.

Solution to Problem

An actuator according to an aspect of the present invention includes a first electrode, a second electrode disposed opposite the first electrode, and an intermediate layer disposed between the first and second electrodes. The intermediate layer contains an electrolyte. The intermediate layer includes a polymer fiber layer. The polymer fiber layer includes a plurality of polymer fibers crossing each other and intertwined three-dimensionally. The polymer fiber layer has fused portions at intersections of the polymer fibers. The actuator deforms as a voltage is applied across the first and second electrodes to cause anions or cations to migrate from the electrolyte to the first or second electrode.

Advantageous Effects of Invention

According to the aspect of the present invention, a bending actuator having good deformation response characteristics and large generative force can be provided.

BRIEF DESCRIPTION OF DRAWINGS

FIG. 3A shows the state before voltage application, and FIG. 3B shows the state after voltage application.

DESCRIPTION OF EMBODIMENTS

An embodiment of the present invention will now be described.

Structure of Actuator

An actuator according to an embodiment of the present invention will now be described with reference to FIG. 1.

The actuator according to this embodiment includes a first electrode, a second electrode, and an intermediate layer between the first and second electrodes.

The first and second electrodes are disposed opposite each other. The intermediate layer contains an electrolyte.

The actuator bends as a voltage is applied across the first and second electrodes to cause anions or cations to migrate from the electrolyte to the first electrode. During this process, the ions that do not migrate to the first electrode can migrate to the second electrode or remain in the electrolyte layer.

Figure 1A:
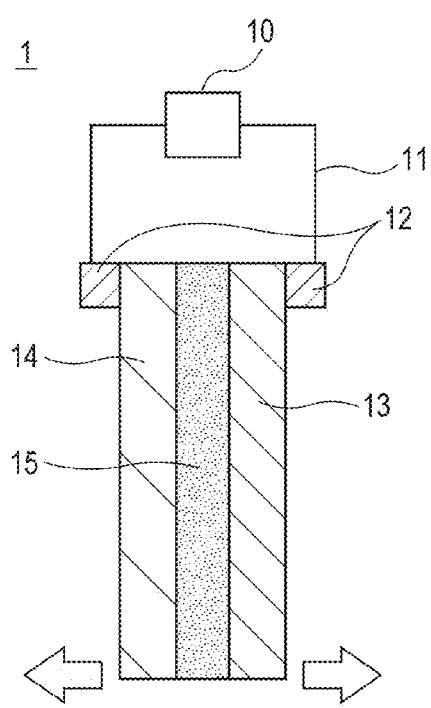
FIG. 1A is a diagram of an actuator according to an embodiment of the present invention.

FIG. 1A is a schematic diagram of an actuator as viewed perpendicularly to the direction in which layers are stacked on top of each other (from left to right across the page of the figure). An actuator 1 includes a pair of opposing electrodes, namely, a first electrode 13 and a second electrode 14, and an intermediate layer 15 disposed therebetween.

Terminals 12 are connected to a power supply 10 with leads 11 to apply a voltage across the electrodes 14 and 15. The terminals 12 hold an end of the actuator 1 (supporting end).

As the power supply 10 applies a voltage across the terminals 12, the voltage is applied across the first electrode 13 and the second electrode 14. Because the intermediate layer 15 contains an electrolyte, the applied voltage causes ions to migrate from the electrolyte to at least one of the electrode layers. As a result, the longitudinal end (displacement end) of the actuator 1 bends in one of the directions indicated by the two block arrows in the figure.

That is, the actuator 1 is an ion migration actuator. The migrating ions are cations or anions, or both, which have different sizes. This difference results in uneven volume expansion in the actuator 1 due to uneven distribution of ions after migration, thus allowing the actuator 1 to bend. As disclosed in Japanese Patent Laid-Open No. 2008-228542, a technique is also known that immobilizes ions of one type in an electrolyte layer. In this case, again, migration of ions of the other type causes uneven volume expansion.

Unlike an extensible actuator, such as the one disclosed in PTL 1, the three-layer bending actuator according to this embodiment does not require the intermediate layer to be extensible in the longitudinal direction. This means that the mechanical strength of the intermediate layer in bending can be improved.

In addition, the intermediate layer includes a polymer fiber layer.

The polymer fiber layer includes a plurality of polymer fibers crossing each other and intertwined three-dimensionally. The polymer fiber layer has fused portions at intersections of the polymer fibers.

This provides the backbone dimensionally supporting the intermediate layer with porosity and strength demanded of actuators.

The porous structure facilitates ion migration through its pores under a potential difference between the two electrodes.

The polymer fibers form a strong porous wall structure. In addition, these fibers are partially fused together to form a strong, flexible network. Furthermore, the wall structure is formed of an assembly of thin polymer fibers that allow it to deform flexibly under external force and to recover from deformation. Unlike a porous layer formed by foaming, the fiber assembly does not come off in small flakes after deformation.

Thus, the polymer fibers improve the efficiency with which a voltage applied across the two electrode layers causes ions to migrate from the electrolyte to at least one of the two electrode layers, and also improve the ability to deform flexibly and recover from deformation, thus providing a bending actuator having good deformation response characteristics.

The polymer fibers can have an average diameter of 1 nm to 50 μm.

In addition, a film having a higher mechanical strength can be formed using polymer fibers having the molecules thereof oriented therein. In the polymer fibers, 30% by mass or more of the molecules can be oriented. If 30% by mass or more of the molecules are oriented, the resulting film often exhibits a noticeable difference in Young's modulus from an unoriented film such as a cast film. The molecular orientation of the polymer chains in the polymer fibers can be examined by a known technique such as X-ray analysis or infrared or Raman spectroscopy. In particular, nano-sized (1 to 1,000 nm in average diameter) polymer fibers (polymer nanofibers) induce a significant supramolecular arrangement effect during production of the polymer fibers. That is, the polymer nanofibers are so thin that the polymer chains are stretched along the length of the fibers in the narrow regions inside the polymer fibers during production of the polymer fibers, which makes the polymer chains less aggregated and intertwined. Thus, the molecular chains are noticeably stretched inside the fibers and are therefore regularly arranged, that is, oriented.

For example, J. Phys. Chem. B, Vol. 113, No. 40, 2009 reports that in X-ray analysis and infrared polarization spectroscopy, nanofibers of poly[(R)-3-hydroxybutyrate-co-(R)-3-hydroxyvalerate] (PHBV) show peaks and bands due to molecular orientation that are not observed from a polymer film formed by casting (randomly oriented film). This paper also reports that reducing the fiber diameter from 1,752 nm to 513 nm, namely, making the fibers nano-sized, induces a supramolecular arrangement effect to dramatically increase the mechanical strength (tensile strength), namely, from 23 MPa to 268 MPa.

The supramolecular arrangement effect increases both flexibility and mechanical strength, thus providing an actuator having better deformation response characteristics.

Oriented polymer fibers can be formed by performing molecular orientation treatment on a polymer material in a random molecular orientation.

Figure 1B:
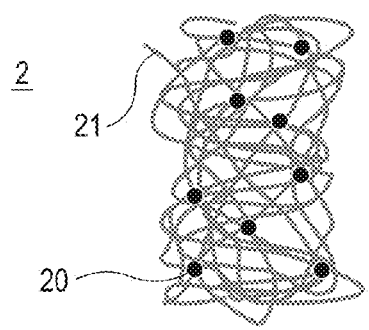
FIG. 1B is a schematic diagram of an intermediate layer in which oriented polymer fibers are partially fused together.
Figure 1C:
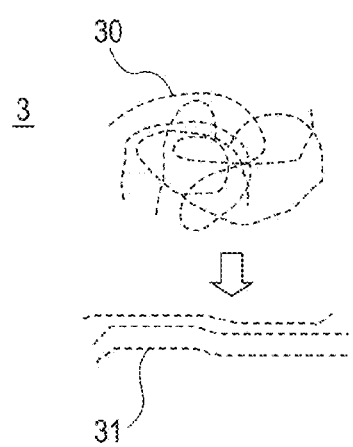
FIG. 1C is a schematic diagram showing how the state of polymer chains changes after molecular orientation treatment.

FIG. 1C schematically shows the state (30) of polymer chains 3 in a polymer material in a random molecular orientation before molecular orientation treatment and the state (31) of the polymer chains 3 after molecular orientation treatment.

Figure 2A:
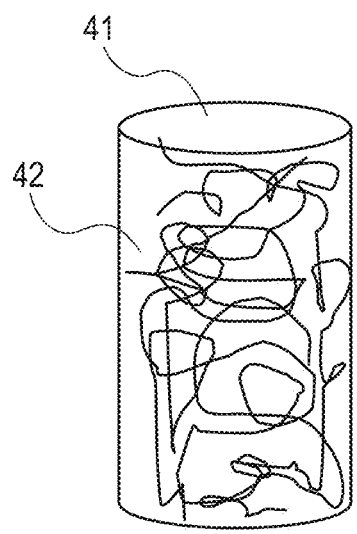
FIGS. 2A and 2B are schematic diagrams showing different states of polymer chains in polymer fibers.
Figure 2B:
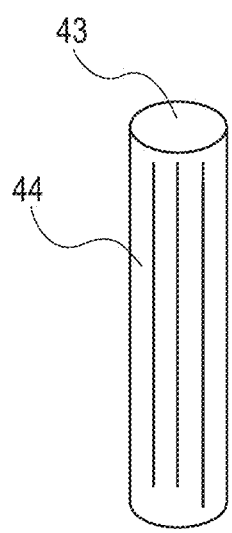

FIG. 2A shows the state of intertwined polymer chains 42 in a thick polymer fiber 41, and FIG. 2B schematically shows the state of oriented polymer chains 44 in a thin polymer fiber 43.

As a result, the intermediate layer becomes more flexible and strong, thus providing a bending actuator having better deformation response characteristics and larger generative force.

A polymer material produced by a known process often includes aggregated or intertwined polymer chains. Examples of such states include a random coil state, or an unoriented state. With orientation treatment, the polymer chains are stretched and oriented in the polymer material. Examples of orientation treatment include drawing and stretching.

Examples of methods for forming fibers having polymer chains oriented therein include drawing or stretching a polymer film formed by casting and spinning a dissolved or molten polymer material (for example, electrospinning, multicomponent fiber spinning, polymer blend spinning, meltblown spinning, or flash spinning).

The attraction between the polymer molecules becomes stronger as the contact area between the polymer molecules becomes larger, that is, as the polymer chains become more regularly oriented. Accordingly, the material becomes stronger.

That is, oriented polymer fibers form a matrix with high mechanical strength in the intermediate layer. In addition, the polymer fibers have fused portions at the intersections thereof. This forms a structure in which, unlike a simple nonwoven fabric, the fibers are fused together and are therefore less easily displaced under a load. Although the fibers that are less easily displaced are less easily extended, the above effect can be sufficiently utilized for bending actuators.

FIG. 1B is a schematic diagram of a polymer fiber film 2 including at least partially fused polymer fibers 21 in the intermediate layer. The polymer fibers 21 have fused portions 20. With this structure, the intermediate layer achieves extremely high mechanical strength.

In addition, an intermediate layer including thinner polymer fibers is more flexible and is therefore more suitable for bending actuators.

Specifically, the maximum bending stress of the fibers (the maximum resisting force $\sigma_{max}$ acting in the member) can be determined by the following equation:

$$\text{Maximum bending stress } (\sigma_{max}) = \text{bending moment } (M)/\text{section modulus } (Z) \quad (1)$$

Assuming that the fibers have a circular cross section with a diameter of d, the section modulus (Z) is $\pi d^3/32$, and the cross-sectional area is $\pi d^2/4$.

To compare thick fibers having a diameter of $d_1$ with thin fibers having a diameter of $d_2$ for the same volume, let the cross-sectional area of one fiber having a diameter of $d_1$ be equal to the sum of the cross-sectional areas of N thin fibers having a diameter of $d_2$, that is:

$$\pi d_1^2/4 = N(\pi d_2^2/4) \quad (2)$$

Hence, N is represented by the following equation:

$$N = d_1^2/d_2^2 \quad (3)$$

On the other hand, the relationship between the section modulus $Z_1$ of one fiber having a diameter of $d_1$ and the section modulus $Z_2$ of N fibers having a diameter of $d_2$ is represented by the following equation:

$$Z_1 : Z_2 = \pi d_1^3/32 : N(\pi d_2^3/32) \quad (4)$$

Hence, with the same bending moment (M), the ratio of the maximum bending stress $\sigma_1$ of one fiber having a diameter of $d_1$ to the maximum bending stress $\sigma_2$ of N fibers having a diameter of $d_2$ is obtained from equations (1) and (4) as the following equation:

$$\sigma_2/\sigma_1 = d_1^3/Nd_2^3 \quad (5)$$

With equation (3), equation (5) can be further transformed into the following equation:

$$\sigma_2/\sigma_1 = d_1/d_2 \quad (6)$$

where $\sigma_2 > \sigma_1$ because $d_1 > d_2$.

As above, if polymer fibers having different diameters but the same volume are disposed in the intermediate layer, fibers having a smaller diameter have a larger maximum bending stress and are therefore more flexible. Whereas the actuator described in this embodiment has a rectangular cross section perpendicular to the stacking direction, various shapes can be selected, including flat rectangles, circles, triangles, and ovals.

In this embodiment, the first and second electrodes can have the same or different shapes. In addition, the actuator can be used alone or as a composite of a plurality of actuators.

In addition, the layer structure of the actuator according to this embodiment is not limited to the above three-layer structure, which is represented as electrode layer/intermediate layer/electrode layer, where the symbol "/" indicates that the layers on both sides of it are in contact with each other.

Any other layer structure can be selected depending on the intended performance as long as the actuator is based on the above three-layer structure and is configured to bend. For example, the electrode layers can be at least partially covered with a flexible insulating layer, or another electrode layer can be stacked on the electrode layers.

In addition, whereas the intermediate layer shown in the schematic diagram in FIGS. 1A to 1C includes randomly oriented polymer fibers, the polymer fibers may be partially uniaxially oriented in the plane of the intermediate layer or may form a plurality of segments having different orientations in the intermediate layer. If all the polymer fibers have the same orientation, the actuator achieves even better deformation response characteristics (displacement) or larger generative force. For example, the polymer fibers can be oriented so that the actuator has a higher mechanical strength in the bending direction for increased generative force. For example, in the case of FIG. 1A, the polymer fibers in the intermediate layer can be oriented in the longitudinal direction of the actuator.

Actuation of Actuator

The actuator according to this embodiment bends as a voltage is applied across the pair of electrodes to cause ions in the electrolyte to migrate. The bending mechanism of the actuator according to this embodiment, in which the intermediate layer is disposed between the pair of electrodes, will now be described with reference to FIGS. 3A and 3B.

Figure 3A:
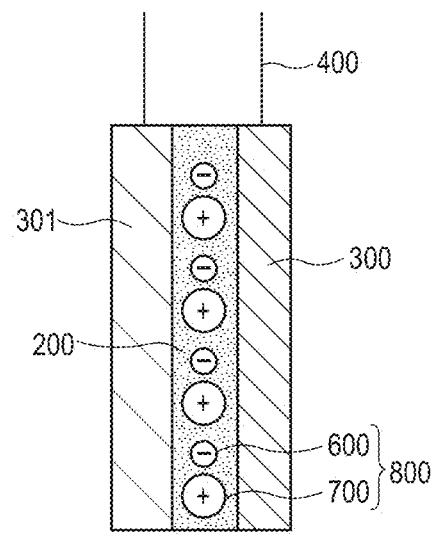
FIGS. 3A and 3B are schematic diagrams showing migration of ions in the actuator, where
Figure 3B:
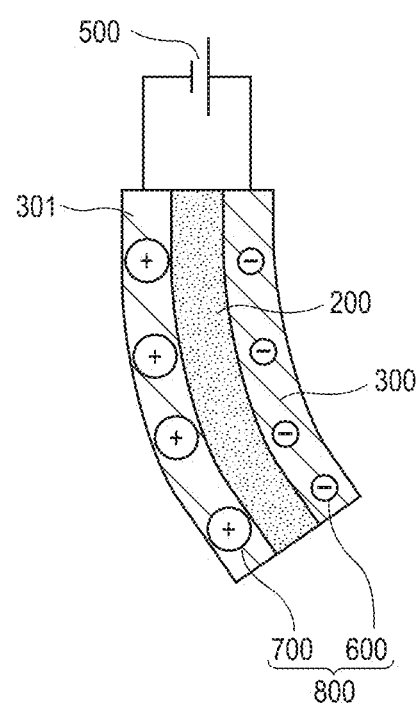

Referring to FIG. 3A, two electrode layers 300 and 301 are formed on an intermediate layer 200 so as to be insulated from each other. Referring to FIG. 3B, a potential difference applied across the electrode layers 300 and 301 causes cations 700 and anions 600 in an electrolyte 800 to migrate. Specifically, the cations 700 migrate into the electrode layer 301, which serves as the cathode, whereas the anions 600 migrate into the electrode layer 300, which serves as the anode. This forms an electric double layer at the interface between the conductive material in the electrode layers 300 and 301 and the ionic material phase. For actuation in air, the electrolyte 800 used in this embodiment can be an ionic liquid, which has negligible vapor pressure. In the ionic liquid, the cations 700 have a larger ionic radius than the anions 600. As a result, the electrode 301 expands more than does the electrode 300 because of the steric effect of the ions present in the electrode layers 300 and 301 in cooperation with electrostatic repulsion due to the electric double layer. Accordingly the actuator bends in the direction in which the cathode extends more than does the anode. In general, the film bends in the opposite direction if the polarity of the potential is reversed. In addition, the displacement direction varies depending on the electrode layers and the intermediate layer.

Bending also occurs in the same manner in the case where either cations or anions are immobilized in the intermediate layer and only the other ions migrate. In this case, bending occurs due to expansion of either electrode, rather than due to the difference in expansion between the two electrodes.

The voltage applied to the actuator according to this embodiment can be set so as not to exceed the withstand voltage of the electrolyte. For example, the actuator can be operated at ±4 V or less if the electrolyte is an ionic liquid.

First and Second Electrodes

There is not particular limitation on the first and second electrodes used in this embodiment, and electrodes known in the related art for use with organic polymer actuators (soft actuators) can be used. Examples of such electrodes include conductive polymers, compacts of conductive materials such as carbon nanotubes (CNTs), and single-film flexible electrode layers containing at least a polymer and a conductive material such as CNTs.

For example, the electrodes can be films containing a conductive material, an electrolyte, and a polymer and formed by casting.

In particular, the electrodes can be gel electrodes containing CNTs and an ionic liquid or flexible electrodes further containing a binder polymer, or can be thin metal layers formed by plating, sputtering, or evaporation.

The electrodes can have a shape such as a square or oval. In particular, the electrodes can have an elongated shape because the larger the length from one end to the other end, the larger displacement the actuator produces in bending. In addition, the first and second electrodes can be formed of the same or different materials and can be formed in the same or different shapes.

Intermediate Layer

In the actuator according to this embodiment, the intermediate layer includes at least polymer fibers. In particular, the intermediate layer can be a polymer fiber film formed of polymer fibers. Alternatively, the intermediate layer can be a polymer film, known as an electrolyte film in the related art, on which polymer fibers are stacked or in which polymer fibers are embedded.

The intermediate layer can have high porosity in view of the efficiency with which ions migrate as a voltage is applied. However, the mechanical strength of the intermediate layer decreases as the polymer material used as the matrix becomes more porous. The inventors have found that an intermediate layer having a porous backbone structure including highly oriented polymer fibers has high strength and allows flexible deformation, thus achieving the invention.

In particular, the porous backbone structure can be formed only of polymer fibers. This provides a structure having high strength and porosity high enough to improve the ion migration efficiency.

In addition, the intermediate layer contains at least an electrolyte. The electrolyte can be an ionic liquid, described later.

In this embodiment, the polymer fibers are formed of at least one type of polymer, and the length thereof is longer than the thickness thereof.

The polymer fibers can have a thickness of 1 nm to 50 µm (50,000 nm), and the length thereof can be ten times or more the thickness thereof.

In particular, as described above, thinner polymer fibers have a larger maximum bending stress and are therefore more flexible. In addition, as described above, the orientation of polymer chains (molecular orientation) is higher in thinner polymer fibers.

As a result, the intermediate layer has higher flexibility and mechanical strength. Thus, the polymer fibers can have a thickness of 10 µm or less. In particular, polymer fibers having a thickness of less than 1 µm, namely, nano-sized fibers, induce a significant supramolecular arrangement effect, so that the polymer chains in the fibers are highly oriented.

As above, the polymer fibers of the polymer fiber film in the intermediate layer preferably have an average diameter of 1 nm to 50 µm, more preferably 10 µm or less, and still more preferably less than 1 µm. In view of manufacture, the polymer fibers can include some thick or thin fibers.

The cross-sectional shape of the polymer fibers can be any shape such as a circle, oval, rectangle, polygon, or semicircle, can be inaccurate, and can vary in any cross section. If the polymer fibers have a circular cross section, the thickness of the polymer fibers refers to the diameter of the circular cross section; for other shapes, the thickness refers to the length of the longest straight line passing through the center of gravity in the cross section of the fibers.

Method for Producing Polymer Fibers

Examples of methods for producing the polymer fibers include, but not limited to, electrospinning, multicomponent fiber spinning, polymer blend spinning, melt-blown spinning, and flash spinning.

In particular, the polymer fibers can be produced by electrospinning because various polymers can be spun into fibers, the fiber shape can be relatively easily controlled, nano-sized fibers can be formed, and meter-sized large electrode layers can be produced.

Figure 4:
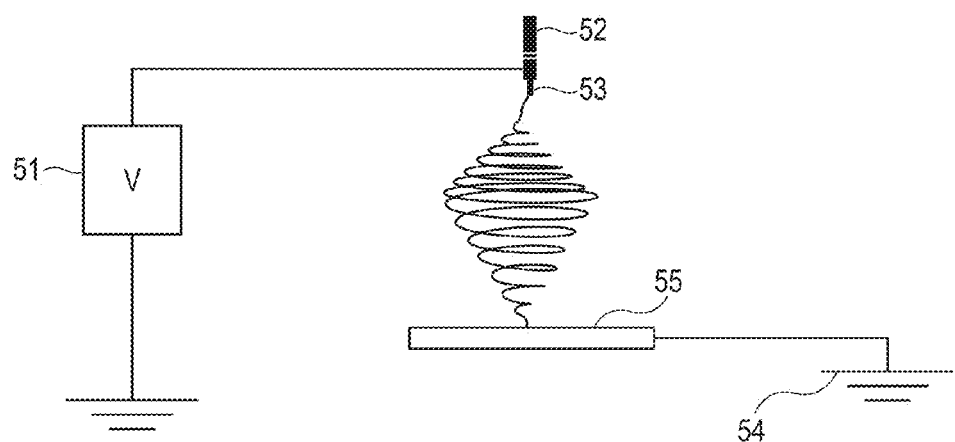
FIG. 4 is a diagram showing an electrospinning apparatus for producing polymer fibers.

A method for producing the polymer fibers by electrospinning will now be described with reference to FIG. 4. As shown in FIG. 4, this method is performed using a high-voltage power supply 51, a tank 52 storing a polymer solution, a spinneret 53, and a collector 55 connected to a ground 54.

The polymer solution is pumped from the tank 52 to the spinneret 53 at a predetermined speed. A voltage of 1 to 50 kV is applied to the spinneret 53. When the electrostatic attraction overcomes the surface tension of the polymer solution, a jet of the polymer solution is ejected toward the collector 55. During this process, the solvent contained in the jet volatilizes gradually, and the size of the jet is decreased to the nano level before it reaches the collector 55. The jet then forms the intermediate layer on the collector 55. The polymer solution can be replaced with a molten polymer heated to its melting point or higher.

The film of the polymer fibers can be directly examined using a scanning electron microscope (SEM). In addition, the average diameter of the polymer fibers can be determined by capturing an image of the polymer fibers (film) by SEM, importing the image into the image analysis software "Image J," and measuring the width of the polymer fibers at any 50 points.

Molecular Orientation of Polymer Chains in Polymer Fibers

In the actuator according to this embodiment, the polymer chains in the polymer fibers are oriented.

As used herein, the phrase "the polymer chains are oriented" means that the polymer chains in the polymer fibers are at least partially uniaxially aligned. For improved strength, the polymer chains can be uniaxially aligned in the longitudinal direction of the polymer fibers.

There is not particular limitation on the method for orienting the polymer chains in the polymer fibers, and a known method can be used. For example, the oriented polymer fibers used in this embodiment can be efficiently formed by electrospinning, multicomponent fiber spinning, polymer blend spinning, melt-blown spinning, or flash spinning because these spinning processes involve orientation treatment by drawing. For electrospinning, particularly, nano-sized polymer fibers can be easily produced by optimizing, for example, the concentration of the sample solution and the voltage applied.

In electrospinning, a jet of a polymer solution can be ejected onto a rotary drum collector around which a fiber can be wound to continuously spin a fiber, thereby extremely easily producing an intermediate layer including polymer fibers uniaxially aligned in the plane of the intermediate layer.

Method for Examining Orientation of Polymer Chains in Polymer Fibers

If the polymer fibers are anisotropically arranged in the plane of the intermediate layer, the orientation of the polymer chains in the polymer fibers can be easily examined by X-ray scattering or polarization spectroscopy. If the polymer fibers are randomly arranged, the orientation of the polymer chains in the polymer fibers can be examined by differential scanning calorimetry (DSC), or more simply, by comparing the Young's modulus of the film.

Fusion of Polymer Fibers

The fusion of the polymer fibers in this embodiment means that the polymer fibers soften and adhere to the adjacent ones such that the boundaries therebetween are planar or disappear.

Examples of the method for fusing the polymer fibers include, but not limited to, thermal fusion, ultrasonic fusion, friction fusion, fusion by thermal compression (hot pressing), and bonding using another component such as an adhesive. For ease of handling, thermal fusion can be used. For uniform thickness, hot pressing can be used. As used herein, the term "hot pressing" refers to both pressing under heating and heating in a pressed state.

Hot pressing can be performed at any temperature below the decomposition temperature of the polymer. The temperature, pressure, and time of hot pressing can be selected depending on, for example, the polymer used, the polymer compound forming the actuator, and the ion species to migrate. For example, the temperature of hot pressing can be 30° C. to 150° C. The pressure is preferably 1 to 100 kg/cm$^2$, more preferably 10 to 50 kg/cm$^2$.

The fusion of the polymer fibers can be easily confirmed by carrying out SEM before and after the fusion step. In addition, the increase in the strength of the intermediate layer after the fusion of the polymer fibers can be easily confirmed by measuring the Young's modulus of the corresponding film before and after the fusion step.

Constituent Materials of Actuator

Constituent Materials of Electrode Layers

As a conductive material, the electrolyte layers can contain a carbon-based conductive material or a mixture of carbon-based conductive materials. Examples of carbon-based conductive materials include graphite, carbon black, acetylene black, Ketjen black, active carbon fiber, and nanocarbon materials such as carbon whiskers (vapor-grown carbon), carbon (nano)filaments, carbon nanoparticles, graphene, and CNTs. Conductive polymers can also be used. Of these, nanocarbon materials, particularly CNTs, can be used in terms of conductivity and specific surface area.

CNTs, one of the nanocarbon materials, are rolled-up sheets of graphite having diameters of 1 to 10 nm. CNTs, used for the actuator according to this embodiment, are a carbon-based material composed of rolled-up graphene sheets. Various types of CNTs are known and are generally divided into single-walled CNTs (SWCNTs) and multi-walled CNTs (MWCNTs) according to the number of circumferential walls. Any type of CNTs can be used for the actuator according to this embodiment.

Carbon nanoparticles, one of the nanocarbon materials that can be used for the actuator according to this embodiment, are nano-scale ($10^{-6}$ to $10^{-9}$ m) carbon-based particles other than CNTs, including carbon nanohorns, amorphous carbon, and fullerene. Carbon nanohorns are carbon nanoparticles formed of graphite sheets rolled into cones such that they have closed conical ends.

Carbon nanofilaments, one of the nanocarbon materials that can be used for the actuator according to this embodiment, are rolled-up sheets of graphite having diameters of 10 to 1,000 nm and are also called carbon nanofibers. Carbon nanofibers are highly branched hollow carbon-based fibers having thicknesses of 75 nm or more. Examples of commercial products include VGCF and VGNF available from Showa Denko K.K.

Graphene, one of the nanocarbon materials that can be used for the actuator according to this embodiment, is a part of the graphite structure and is an assembly of carbon atoms forming a two-dimensional arrangement of planar six-membered carbon rings, that is, a single layer of carbon.

The content of the conductive material in the electrode layers of the actuator according to this embodiment can be 1% or more of the weight of the electrode layers. If the content is 1% or more of the weight of the electrode layers, they have sufficient electrical conductivity to function as the electrodes of the actuator. If the content is less than 1% of the weight of the electrode layers, they may have insufficient conductivity.

The polymer used for the electrode layers can be any polymer flexible enough to deform as the actuator deforms. For example, the polymer can be one poorly hydrolysable and stable in air. Examples of such polymers include polyolefins such as polyethylene and polypropylene; polystyrenes; polyimides; polyarylenes (aromatic polymers) such as poly(p-phenylene oxide), poly(2,6-dimethylphenylene oxide), and poly(p-phenylene sulfide); polyolefins, polystyrenes, polyimides, and polyarylenes (aromatic polymers) having a sulfonate (—SO$_3$H), carboxyl (—COOH), phosphate, sulfonium, ammonium, or pyridinium group introduced thereto; fluoropolymers such as polytetrafluoroethylene and polyvinylidene fluoride; fluoropolymers having a sulfonate, carboxyl, phosphate, sulfonium, ammonium, or pyridinium group introduced thereto, such as perfluorosulfonate polymers, perfluorocarboxylate polymers, and perfluorophosphate polymers; polybutadienes; polyurethanes such as elastomers and gels; silicones; polyvinyl chloride; polyethylene terephthalate; nylons, and polyarylates. These polymers can be used alone or in combination, can be functionalized, and can be copolymerized with another polymer.

In particular, polyvinylidene fluoride-hexafluoropropylene copolymer (PVDF-HFP), polyvinylidene fluoride (PVDF), and poly(methyl methacrylate) (PMMA) can be used in view of the affinity for ionic liquids. In addition, the polymer can be one highly compatible with the intermediate layer. This allows formation of more robust electrodes having higher compatibility with and adhesion to the intermediate layer. For this purpose, the polymer can be one having a polymer structure or functional group that is in the same family as, is similar to, or is identical to that of the polymer compound used for the intermediate layer.

As described above, the electrodes of the actuator according to this embodiment contain a polymer and a conductive material dispersed therein to provide conductivity. The electrodes preferably have a resistivity of 1,000 Ω•cm or less, more preferably 100 Ω•cm or less. In addition, the electrodes can have a Young's modulus of 0.1 to 600 MPa. If the Young's modulus falls within this range, the electrodes are more flexible and extensible and are therefore more resistant to plastic deformation for use in actuators. Thus, an ion migration actuator with higher durability for repeated use can be fabricated.

The electrodes can contain other components that do not impair the function of the actuator. The content of the polymer can be 10% to 60% by weight. Although a higher proportion of the conductive material to the polymer provides a higher conductivity, an electrode layer containing less than 10% by weight of the polymer might lack freestanding ability and be mechanically brittle. On the other hand, an electrode layer containing more than 60% by weight of the polymer contains a relatively small amount of conductive material and might therefore be unsuitable for practical use in view of, for example, the response speed and generative force of the actuator.

The electrode layers can have any thickness that does not impair the extension of the actuator. Preferably, the electrode layers each have a thickness of 1 µm to 5 mm, more preferably 5 µm to 2 mm, and still more preferably 10 µm to 500 µm. An electrode layer having a thickness below 1 µm may be problematic in view of electrical conductivity, whereas an electrode layer having a thickness above 5 mm may be hard and brittle because it contains the conductive material. The anode and cathode layers do not necessarily have to have the same thickness or be formed of the same material; they can be appropriately selected depending on the desired actuator characteristics.

Constituent Materials of Intermediate Layer and Polymer Fibers

The intermediate layer and the polymer fibers, which are flexible, can be formed of any polymer material.

As described above, the intermediate layer in this embodiment includes at least a polymer fiber film. In particular, the intermediate layer can be formed of a polymer film, known as an electrolyte film in the related art, on which polymer fibers are stacked or in which polymer fibers are embedded, or can be formed only of polymer fibers.

Examples of polymer materials include fluoropolymers such as polytetrafluoroethylene and polyvinylidene fluoride; polyolefins such as polyethylene and polypropylene; polybutadienes; polyurethanes such as elastomers and gels; silicones; thermoplastic polystyrene; polyvinyl chloride; and polyethylene terephthalate. These polymers can be used alone or in combination, can be functionalized, and can be copolymerized with another polymer.

In addition, the intermediate layer contains at least an electrolyte. This allows the actuator to bend as a voltage is applied across the electrode layers to cause ions to migrate.

Examples of electrolytes include lithium fluoride, lithium bromide, sodium bromide, magnesium chloride, copper sulfate, sodium acetate, and sodium oleate. Ionic liquids can also be used. If an ionic liquid is used, the polymer used can be PVDF-HFP, PVDF, perfluorosulfonate polymers (Nafion), poly(2-hydroxyethyl methacrylate) (PHEMA), PMMA, polyethylene oxide (PEO), or polyacrylonitrile (PAN) because they tend to have high affinity for ionic liquids. As described above, an ionic liquid can also be used as the electrolyte.

Ionic liquids, also called room-temperature molten salts, or simply molten salts, are salts in a molten state over a wide temperature range including room temperature. The ionic liquid used for the actuator according to this embodiment is in a molten state, for example, at 0° C., preferably −20° C., more preferably −40° C. In particular, an ionic liquid having high ionic conductivity can be used.

Any known ionic liquid can be used for the actuator according to this embodiment. In particular, a stable ionic liquid that is in a liquid state at or near room temperature can be used. Examples of ionic liquids used for the actuator according to this embodiment include imidazolium salts, pyridinium salts, ammonium salts, and phosphonium salts. These ionic liquids can be used alone or in a combination of two or more.

More specifically, the ionic liquid can be exemplified by those composed of cations represented by general formulas (1) to (4) and anions:

[Chem. 1]

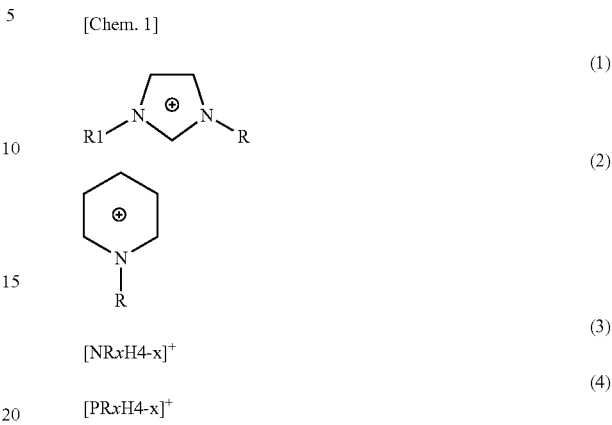

In formulas (1) to (4) above, R is an alkyl group having 1 to 12 carbon atoms or an alkyl group including an ether bond and having a total of 3 to 12 atoms of carbon and oxygen. In formula (1), $R_1$ is an alkyl group having 1 to 4 carbon atoms or a hydrogen atom. In formula (1), R and $R_1$ can be different. In formulas (3) and (4), x is an integer of 1 to 4. An ionic liquid having an imidazolium salt backbone represented by formula (1) generally tends to have low viscosity and high ionic conductivity, whereas an ionic liquid having an ammonium salt backbone represented by formula (3) or a phosphonium salt backbone represented by formula (4) tends to have a higher withstand voltage (wider potential window). This is because, as reported in Chem. Commun., 2004, 1972-1973, an imidazolium ion is electrochemically easily reductively decomposed into carbene (see formula (5)).

That is, an ionic liquid having an ammonium salt backbone or phosphonium salt backbone tends to have a wider potential window, particularly on the reduction side. As a result, an actuator using such an ionic liquid can actuate over a wide input voltage range.

[Chem. 2]

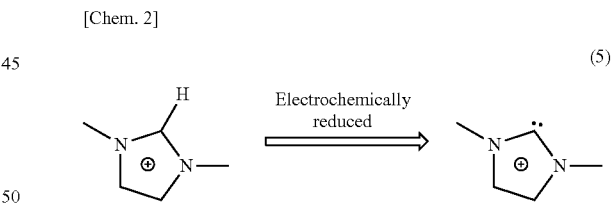

Instead of the linear structures represented by formulas (3) and (4), the cation of an ionic liquid having an ammonium salt backbone or phosphonium salt backbone in this embodiment can be one having a cyclic onium salt backbone represented by formula (6):

[Chem. 3]

In formula (6), $Y_1$ and $Y_2$ are each an alkyl group having 1 to 10 carbon atoms or a hydrogen atom, Z is a nitrogen or phosphorous atom, and m is an integer of 0 to 4.

As described above, because the actuator according to this embodiment actuates as an ion species migrates into the electrode layers upon application of a voltage, a cyclic ion species, which is expected to provide a larger apparent ion volume than a linear ion species, is presumably more suitable for ion migration actuators in terms of ion volume.

The anion can be at least one anion selected from anions of tetrafluoroboric acid, hexafluorophosphoric acid, bis(trifluoromethanesulfonyl)imidic acid, perchloric acid, tris(trifluoromethanesulfonyl)carbon acid, trifluoromethanesulfonic acid, dicyanamide, trifluoroacetic acid, and organic carboxylic acids, and halide ions.

The thickness of the intermediate layer is preferably 10 to 500 μm, more preferably 10 to 400 μm. If the thickness exceeds 500 μm, the film has high elastic modulus and may therefore suppress the deformation of the actuator. On the other hand, if the thickness falls below 10 μm, the actuator may be unable to bend sufficiently because the intermediate layer can hold a smaller amount of ionic material and can therefore supply a smaller amount of ionic material to the electrode layers.

In this embodiment, additionally, the intermediate layer can have a Young's modulus of 0.1 to 600 MPa. It should be understood that the Young's modulus of the polymer material varies greatly depending on the polymer material used because it depends greatly on the molecular structure, backbone, higher-order structure, and morphology thereof. However, if the Young's modulus falls within the above range, the intermediate layer is more flexible and is therefore more resistant to plastic deformation for use in actuators. Thus, an ion migration actuator with higher durability for repeated use can be fabricated.

Method for Fabricating Actuator

The actuator according to this embodiment can be fabricated by any method. For example, an actuator of uniform thickness can be fabricated by subjecting the intermediate layer to hot pressing to fuse the fibers and then pressing the electrode layers thereon.

To impregnate the actuator film with water, an ion conductive material, an ionic liquid, or a mixture thereof after the fabrication of the actuator, the actuator film can be immersed therein. There is not particular limitation on the concentration of the immersion liquid and the immersion time, and a known method can be used.

The shape of the actuator according to this embodiment is not limited to a strip shape; an actuator of any shape can be easily produced.

EXAMPLES

Examples of the present invention will now be described.

Performance Evaluation of Actuators

Strip-shaped actuators having a width of 1 mm, a length of 12 mm, and a predetermined thickness were fabricated. A portion of each actuator extending 2 mm from an end thereof was held by a holder equipped with platinum electrodes (terminals), and a voltage was applied thereto in air (actuation in air). For deformation response characteristics, the actuator was evaluated by measuring displacement at a predetermined position. The displacement was measured at a position 9 mm from the fixed end (actuator measurement point) at an actuation voltage of ±1.0 V and an actuation frequency of 1 Hz using a laser displacement sensor.

In addition, the strain ε was calculated from the displacement measured using the laser displacement sensor by the following equation:

$$\epsilon = 2d\delta/(l^2+\delta^2)$$

where d is the thickness (mm) of the actuator, δ is half the maximum displacement measured using the laser displacement sensor, and l is the distance from the actuator (actuator measurement point) to the laser displacement sensor, which was 8 mm in this measurement.

The Young's modulus was measured using a tensile tester (Shimadzu Corporation).

The generative force of the actuator during bending motion was evaluated using a load cell for evaluation of extremely small force (UL-10GR, Minebea Co., Ltd.).

Specifically, a portion of the actuator, which had a width of 1 mm and a length of 12 mm, extending 2 mm from a longitudinal end thereof was held by a holder equipped with platinum electrodes (terminals), and a voltage of ±2.5 V was applied in air to cause bending motion. The generative force of the actuator during the motion was measured using the load cell at a position 2 mm from the fixed end.

Example 1

Example 1 is an actuator, as shown in FIG. 1A, having a three-layer structure including a pair of electrode layers and an intermediate layer formed of polymer fibers.

The electrode layers were formed by the following procedure.

Put in a vessel were 50 mg of SWCNTs (the trade name "HiPco," Unidym, Inc.), as a conductive material, 100 mg of 1-butyl-3-methylimidazolium tetrafluoroborate ($BMIBF_4$, Kanto Chemical Co., Inc.), as an ionic liquid, and 1 mL of N,N-dimethylacetoamide (DMAc, Kishida Chemical Co., Ltd.), as an organic solvent.

Zirconia balls having a diameter of 2 mm were added to one-third of the volume of the vessel, and dispersion treatment was carried out using a ball mill (planetary micro mill obtained from Fritsch GmbH) at 200 rpm for 30 minutes.

A solution was then prepared by dissolving 80 mg of PVDF-HFP (Sigma-Aldrich Corporation), as a matrix, in DMAc (2 mL) under heating, and dispersion treatment was further carried out at 500 rpm for 60 minutes.

The resulting solution was poured into a template formed of polytetrafluoroethylene (PTFE), was leveled with a blade, and was dried in a vacuum at room temperature to form electrode layers of uniform thickness having the conductive material homogeneously dispersed therein.

The intermediate layer formed of polymer fibers was formed by the following procedure.

First, 800 mg of PVDF-HFP, as a matrix, and 2.4 mL of DMAc, as an organic solvent, were mixed under heating at 80° C.

The resulting solution was ejected from an electrospinning apparatus (Mec Company Ltd.) to spin polymer fibers, where a voltage of 25 kV was applied to a spinneret.

The intermediate layer, formed of polymer fibers collected on a collector, was subjected to hot pressing at 110° C. and 1 kN (newton) for one minute and was cut to a width of 2 mm and a length of 14 mm. In addition, the electrode layers formed as above were cut to a width of 1 mm and a length of 12 mm, were laminated on both sides of the intermediate layer, and were pressed at room temperature and 0.5 kN for one minute to form a corresponding laminate.

The resulting laminate was immersed in an ionic liquid (BMIBF$_4$) for one hour and was dried in a vacuum for about 12 hours. Finally, a portion of the intermediate layer extending off the edge of the laminate was trimmed away, thus forming an actuator. The actuators of the subsequent examples and comparative examples had the same width and length.

Figure 5:
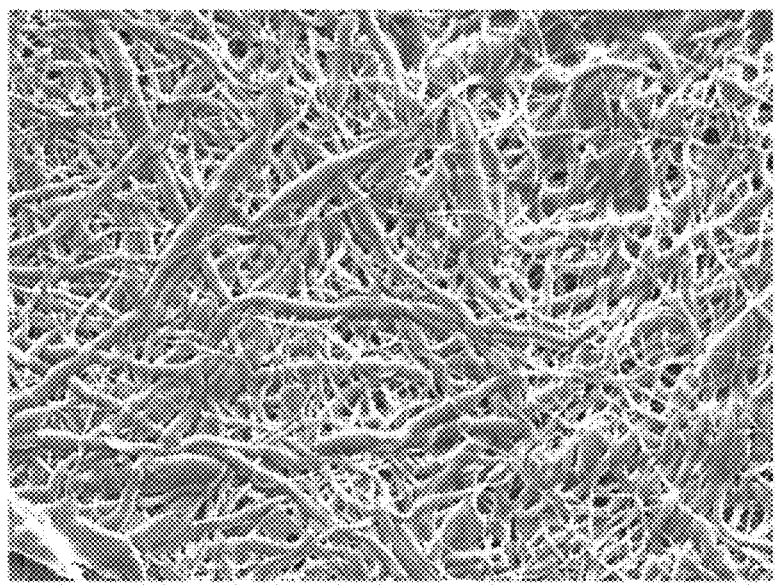
FIG. 5 is an illustration (electron micrograph) showing partially fused polymer fibers in an intermediate layer of Example 1.

The thickness of the resulting actuator was about 135 μm (the thickness of the intermediate layer was about 35 μm, and the thickness of each electrode layer was about 50 μm). The average diameter of the polymer fibers was about 870 nm. As shown in FIG. 5, examination using an SEM (S-4800, Hitachi High-Technologies Corporation) confirmed that a film formed of polymer fibers (intermediate layer) was formed and that the polymer fibers were fused together after the hot pressing step.

Example 2

Example 2 is a modification of Example 1 that differs in the diameter of the polymer fibers.

In Example 2, a corresponding actuator was fabricated in the same manner as in Example 1 except that the intermediate layer was formed as follows.

Specifically, 800 mg of PVDF-HFP, as a matrix, 20 mg of BMIBF$_4$, as an ionic liquid, and 3.2 mL of a mixture of acetonitrile (AcCN) and N,N-dimethylformamide (DMF) (in a ratio of 1.9:1.4), as an organic solvent, were mixed under heating at 80° C.

The resulting solution was ejected from an electrospinning apparatus to spin polymer fibers, where a voltage of 25 kV was applied to a spinneret.

The thickness of the resulting actuator of Example 2 was about 135 μm (the thickness of the intermediate layer was about 35 μm, and the thickness of each electrode layer was about 50 μm). The average diameter of the polymer fibers was about 160 nm. SEM examination confirmed that a film formed of polymer fibers (intermediate layer) was formed and that the polymer fibers were fused together after the hot pressing step.

Example 3

Example 3 is a modification of Example 1 that differs in the diameter of the polymer fibers.

In Example 2, a corresponding actuator was fabricated in the same manner as in Example 1 except that the intermediate layer was formed as follows.

Specifically, 400 mg of PVDF-HFP, as a matrix, 20 mg of BMIBF$_4$, as an ionic liquid, and 2 mL of a mixture of AcCN and DMF (in a ratio of 1:1), as an organic solvent, were mixed under heating at 80° C. The resulting solution was ejected from an electrospinning apparatus to spin polymer fibers, where a voltage of 22 kV was applied to a spinneret.

The thickness of the resulting actuator of Example 3 was about 135 μm (the thickness of the intermediate layer was about 35 μm, and the thickness of each electrode layer was about 50 μm). The average diameter of the polymer fibers was about 100 nm. SEM examination confirmed that a film formed of polymer fibers (intermediate layer) was formed and that the polymer fibers were fused together after the hot pressing step.

Comparative Example 1

In Comparative Example 1, an actuator was fabricated in the same manner as in Example 1 except that a cast film was formed as the intermediate layer as follows.

First, 800 mg of PVDF-HFP, as a matrix, and 2.4 mL of DMAc, as an organic solvent, were mixed under heating at 80° C.

The mixture was then cast into a film and was dried in a vacuum. The resulting intermediate layer was cut to a width of 2 mm and a length of 14 mm. In addition, the electrode layers formed in Example 1 were cut to a width of 1 mm and a length of 12 mm, were laminated on both sides of the intermediate layer, and were pressed at room temperature and 0.5 kN for one minute to form a corresponding laminate. The laminate was immersed in an ionic liquid (BMIBF$_4$) for one hour and was dried in a vacuum for about 12 hours. Finally, a portion of the intermediate layer extending off the edge of the laminate was trimmed away, thus forming an actuator. The thickness of the resulting actuator was about 135 μm (the thickness of the intermediate layer was about 35 μm, and the thickness of each electrode layer was about 50 μm).

Comparative Example 2

Comparative Example 2 is the same as Example 1 except that the intermediate layer was not subjected to the fusion step. That is, an actuator was fabricated in the same manner as in Example 1 except that the hot pressing step in Example 1 was omitted.

The thickness of the resulting actuator was about 135 μm, the thickness of the intermediate layer was about 35 μm, and the thickness of each electrode layer was about 50 μm.

Actuator Performance Evaluation

All the actuators of the Examples, which had a three-layer structure including a porous intermediate layer formed of polymer fibers between a pair of electrode layers, bent smoothly as ions in the electrolyte migrated efficiently upon application of electric energy across the terminals in contact with the electrode layers. This demonstrates that the three-layer structure can be constructed to form a bending actuator.

Table 1 below shows the average diameter of the polymer fibers of the intermediate layers in the Examples, and the Young's modulus of the intermediate layers, the deformation response characteristics (strain) of the actuators, and the generative force of the actuators in the Examples and the Comparative Examples. For the Examples, the Young's moduli before and after hot pressing are shown. The generative force is expressed as a value relative to the value of Comparative Example 1 (i.e., 1).

TABLE 1

| | Average fiber diameter (nm) | Young's modulus of intermediate layer (MPa) | | Strain (%) at ±1 and 0.1 Hz | Generative force (ratio to value of Comparative Example 1) |
| --- | --- | --- | --- | --- | --- |
| | | Before fusion | After fusion | | |
| Example 1 | 870 | 13 | 39 | 0.11 | 1.5 |
| Example 2 | 160 | 17 | 62 | 0.13 | 2.1 |
| Example 3 | 100 | 35 | 77 | 0.22 | 3.4 |
| Comparative Example 1 | Cast film | 0.6 | — | 0.07 | 1 |
| Comparative Example 2 | 870 | 13 | — | 0.1 | 1.2 |

First, a comparison between Examples 1 to 3 and Comparative Example 2, in which the intermediate layer included a polymer fiber film, and Comparative Example 1, in which the intermediate layer was formed of a cast film, demonstrates that an actuator including a polymer fiber film as the intermediate layer had better deformation response characteristics (strain) and larger generative force.

In addition, the intermediate layers formed of polymer fibers in Examples 1 to 3 had significantly higher Young's moduli than the intermediate layer formed by casting in Comparative Example 1, demonstrating that the polymer chains in the polymer fibers were oriented. In addition, the Young's moduli of the intermediate layers formed of polymer fibers in Examples 1 to 3 were significantly improved after the fusion step (hot pressing), demonstrating that the mechanical strength of the intermediate layers of Examples 1 to 3 was improved by fusion.

The actuators of the Examples were stable when actuated repeatedly. Thus, these actuators were ion migration actuators with high actuation durability.

PVDF-HFP, used in the Examples, is a semicrystalline polymer with rubber elasticity and is known as a flexible polymer material. The Examples demonstrated that an actuator with high Young's modulus can be fabricated using PVDF-HFP. In addition, the intermediate layers of the actuators fabricated in the Examples after the fusion step had higher Young's moduli than the intermediate layer of Example 3 before the fusion step (35 MPa).

In addition, the actuators of Example 1 to 3 had significantly larger generative force than those of the Comparative Examples. In particular, the actuator of Example 1 had significantly larger generative force than that of Comparative Example 2, in which the intermediate layer did not undergo the fusion step, without degraded deformation response characteristics (strain). This demonstrates that an actuator according to an embodiment of the present invention simultaneously achieves better deformation response characteristics and larger generative force.

Furthermore, a comparison between Examples 1 to 3 reveals that an intermediate layer including thinner polymer fibers tends to have a higher Young's modulus. This demonstrates that the molecular orientation is higher in thinner polymer fibers, and particularly, is extremely high in polymer fibers having an average diameter of about 100 nm.

Although the intermediate layers of Examples 2 and 3 had similar Young's moduli, the actuator of Example 3, in which the polymer fibers had a smaller average diameter, had better deformation response characteristics and larger generative force than that of Example 2. This demonstrates that the thinner fibers increased the bending stress to make the actuator more flexible.

Next, an example of an actuator using a cation species having a cyclic onium salt structure and another comparative example will be shown.

Example 4

Example 4 is a modification of Example 1 that differs in the type of ionic liquid.

In Example 4, a corresponding actuator was fabricated in the same manner as in Example 1 except that the ionic liquid used in the steps of forming the electrode layers and the intermediate layer was changed from $BMIBF_4$ to a five-membered-ring ammonium salt, namely, 1-butyl-1-methylpyrrolidinium bis(trifluoromethanesulfonyl)imide (BMPyTfNTf, Tokyo Chemical Industry Co., Ltd.).

The thickness of the resulting actuator was about 150 µm, the thickness of the intermediate layer was about 38 µm, and the thickness of each electrode layer was about 56 µm.

Comparative Example 3

Comparative Example 3 is the same as Example 4 except that the type of ionic liquid differs.

Specifically, a corresponding actuator was fabricated in the same manner as in Example 1 except that the ionic liquid used in the steps of forming the electrode layers and the intermediate layer was changed from the five-membered-ring ammonium salt used in Example 4, namely, BMPyTfNTf, to a linear ammonium salt, namely, N,N-diethyl-N-methyl-N-(2-methoxyethyl)ammonium bis(trifluoromethanesulfonyl)imide (DMMATfNTf, Kanto Chemical Co., Inc.).

The thickness of the resulting actuator was about 150 µm, the thickness of the intermediate layer was about 38 µm, and the thickness of each electrode layer was about 56 µm.

Comparison between Cation Species Having Cyclic Onium Salt Structure and Cation Species Having Linear Onium Salt Structure for Withstand Voltage Characteristics and Potential Window A cation species having a cyclic onium salt structure and a cation species having a linear onium salt structure in ionic liquids were compared for withstand voltage characteristics and potential window by comparing the highest occupied molecular orbital (HOMO) energy level and the lowest unoccupied molecular orbital (LUMO) energy level calculated by molecular orbital calculations and actually carrying out sweep voltammetry.

Specifically, the molecular orbital calculations were carried out using Spartan'10 for Windows (Wavefunction, Inc.). Ionic liquids are less easily oxidized as the HOMO level becomes more negative, are less easily reduced as the LUMO level becomes more positive, and are electrochemically more stable as the gap between the HOMO and LUMO levels becomes wider.

The sweep voltammetry was carried out over the range of +3 V to −3.5 V at a sweep rate of 10 mV/sec using interdigital electrodes obtained from BAS Inc.

Table 2 shows results obtained from BMPyTfNTf, DMMATfNTf, and $BMIBF_4$. Table 2 also shows the viscosity of each ionic liquid measured using an oscillating viscometer obtained from Sekonic Corporation and the ionic conductivity of each ionic liquid measured using a compact conductivity

TABLE 2

| | Molecular orbital calculations on cation species | | Potential window | Viscosity | Ionic conductivity |
|---|---|---|---|---|---|
| | HOMO (ev) | LUMO (ev) | (V vs Ag/AgCl) | (mPa · s) | (mS/cm) |
| BMPyTfNTf | −16.90 | 1.91 | −3.1/+2.8 | 90 | 3.0 |
| DMMATfNTf | −15.27 | 2.03 | −3.1/+2.3 | 85 | 3.0 |
| $BMIBF_4$ | −14.38 | −0.39 | −2.0/+2.2 | 89 | 4.9 |

First, the LUMO levels of BMPyTfNTf and DMMATfNTf calculated by the molecular orbital calculations on the cation species were significantly higher than that of $BMIBF_4$, suggesting that an ammonium salt backbone provides a higher reduction resistance than an imidazolium salt backbone. The potential window measurement demonstrated that the potential windows of BMPyTfNTf and DMMATfNTf extended farther than that of $BMIBF_4$ by about −1 V. The reduction potentials of BMPyTfNTf and DMMATfNTf were similar.

On the other hand, the HOMO levels of BMPyTfNTf and DMMATfNTf calculated by the molecular orbital calculations on the cation species were lower than that of $BMIBF_4$, suggesting that an ammonium salt backbone also provides a higher oxidation resistance than an imidazolium salt backbone. The potential window measurement demonstrated that the potential windows of BMPyTfNTf and DMMATfNTf extended slightly farther than that of BMIBF$_4$. Although the HOMO level of BMPyTfNTf was lower than that of DMMATfNTf, the actual oxidation potential of BMPyTfNTf in the potential window measurement was higher than that of DMMATfNTf.

These three ionic liquids had similar viscosities and ionic conductivities.

Figure 6:
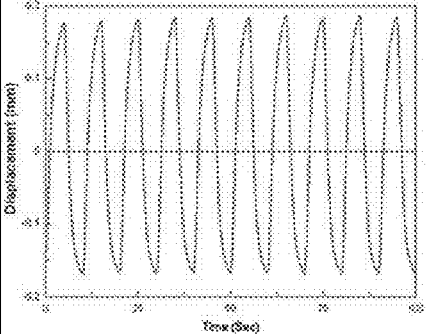
FIG. 6 is a table showing the results of actuation performance of an actuator fabricated according to Example 4 and an actuator fabricated according to a Comparative Example.
Figure 6:
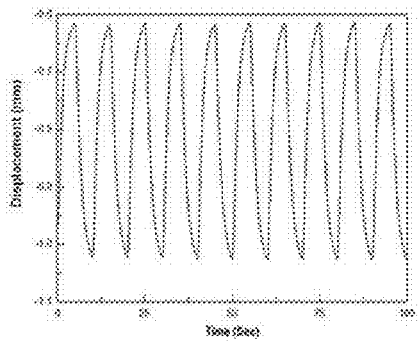

FIG. 6 shows results of the actuation performance of the actuator fabricated using BMPyTfNTf as an ionic liquid in Example 4 and the actuator fabricated using DMMATfNTf as an ionic liquid in Comparative Example 3.

As a result, the displacement of the actuator fabricated using BMPyTfNTf as an ionic liquid in Example 4 was about 30% higher than that of the actuator fabricated using DMMATfNTf as an ionic liquid in Comparative Example 3.

In addition, the displacement of the actuator fabricated using BMPyTfNTf as an ionic liquid did not change noticeably after being actuated 8,000 times at ±2.8 V.

The above results demonstrate that an actuator fabricated using a cyclic onium salt as an electrolyte can produce large displacement and actuate stably with a wide potential window.

Although examples of the present invention have been described above, the invention is not limited thereto.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2010-224152, filed Oct. 1, 2010, which is hereby incorporated by reference herein in its entirety.

REFERENCE SIGNS LIST 10 power supply
11 lead
12 terminal
13, 14 electrode (layer)
15 intermediate layer

The invention claimed is:

1. An actuator comprising:
a first electrode;
a second electrode disposed opposite the first electrode; and
an intermediate layer disposed between the first and second electrodes, the intermediate layer containing an electrolyte, the intermediate layer including a polymer fiber layer, the polymer fiber layer including a plurality of polymer fibers crossing each other and intertwined three-dimensionally, the polymer fiber layer having fused portions at intersections of the polymer fibers;
wherein the actuator deforms as a voltage is applied across the first and second electrodes to cause anions or cations to migrate from the electrolyte to the first or second electrode.

2. The actuator according to claim 1, wherein the actuator deforms as a voltage is applied across the first and second electrodes to cause anions or cations to migrate from the electrolyte to the first electrode and the ions that do not migrate to the first electrode to migrate to the second electrode.

3. The actuator according to claim 1, wherein the intermediate layer has a Young's modulus of 0.1 to 600 MPa.

4. The actuator according to claim 1, wherein the polymer fibers have an average diameter of 1 nm to less than 50,000 nm.

5. The actuator according to claim 1, wherein the first and second electrodes contain at least a nanocarbon material and a polymer material.

6. The actuator according to claim 1, wherein the electrolyte is a cyclic onium salt.

7. The actuator according claim 2, wherein the polymer fibers have an average diameter of 1 nm to less than 50,000 nm.

8. The actuator according claim 3, wherein the polymer fibers have an average diameter of 1 nm to less than 50,000 nm.

9. The actuator according to claim 2, wherein the first and second electrodes contain at least a nanocarbon material and a polymer material.

10. The actuator according to claim 3, wherein the first and second electrodes contain at least a nanocarbon material and a polymer material.

11. The actuator according to claim 4, wherein the first and second electrodes contain at least a nanocarbon material and a polymer material.

12. The actuator according to claim 2, wherein the electrolyte is a cyclic onium salt.

13. The actuator according to claim 3, wherein the electrolyte is a cyclic onium salt.

14. The actuator according to claim 4, wherein the electrolyte is a cyclic onium salt.

15. The actuator according to claim 5, wherein the electrolyte is a cyclic onium salt.

* * * * *